United States Patent
Cao et al.

(10) Patent No.: US 10,756,061 B2
(45) Date of Patent: Aug. 25, 2020

(54) MULTI-LAYER CHIP AND FABRICATION METHOD THEREOF

(71) Applicant: Wuhan Xinxin Semiconductor Manufacturing Co., Ltd., Wuhan, Hubei (CN)

(72) Inventors: Jing Cao, Hubei (CN); Sheng Hu, Hubei (CN)

(73) Assignee: Wuhan Xinxin Semiconductor Manufacturing Co., Ltd., Wuhan, Hubei (CN)

( * ) Notice: Subject to any disclaimer, the term of this patent is extended or adjusted under 35 U.S.C. 154(b) by 0 days.

(21) Appl. No.: 16/249,449

(22) Filed: Jan. 16, 2019

(65) Prior Publication Data
US 2019/0221545 A1 Jul. 18, 2019

(30) Foreign Application Priority Data
Jan. 17, 2018 (CN) .......................... 2018 1 0045173

(51) Int. Cl.
| H01L 25/065 | (2006.01) |
| H01L 23/00 | (2006.01) |
| H01L 25/00 | (2006.01) |
| H01L 23/48 | (2006.01) |
| H01L 21/768 | (2006.01) |

(52) U.S. Cl.
CPC .... *H01L 25/0657* (2013.01); *H01L 21/76898* (2013.01); *H01L 23/481* (2013.01); *H01L 24/33* (2013.01); *H01L 24/83* (2013.01); *H01L 25/50* (2013.01); *H01L 2225/06541* (2013.01)

(58) Field of Classification Search
CPC ....... H01L 25/0657; H01L 2225/06541; H01L 25/18; H01L 25/50; H01L 24/33; H01L 23/481; H01L 21/76898; H01L 24/83; H01L 24/92; H01L 2224/9202; H01L 2224/0557; H01L 2224/80357; H01L 27/0688; H01L 2224/09181
See application file for complete search history.

(56) References Cited

U.S. PATENT DOCUMENTS 5,608,264 A * 3/1997 Gaul ..................... H01L 23/481
257/734
2017/0373044 A1 12/2017 Das et al.
2018/0012932 A1 1/2018 Oliver et al.

FOREIGN PATENT DOCUMENTS

| CN | 101740421 A | 6/2010 |
| CN | 104025285 A | 9/2014 |
| CN | 105513983 A | 4/2016 |

* cited by examiner

*Primary Examiner* — Jasmine J Clark
(74) *Attorney, Agent, or Firm* — Muncy, Geissler, Olds & Lowe, P.C.

(57) ABSTRACT

A multi-layer chip and a fabrication method thereof are disclosed. The method includes: bonding a first chip having a first metal layer to a second chip having a second metal layer; forming a first metal contact in the second chip, the first metal contact connecting to the second metal layer; depositing oxide on the second chip to form a first oxide layer; bonding the first oxide layer and a second oxide layer of a third chip; and forming a second metal contact penetrating through the first oxide layer and the second oxide layer for connecting the first metal contact with a third metal layer in the third chip via the second metal contact.

12 Claims, 3 Drawing Sheets

MULTI-LAYER CHIP AND FABRICATION METHOD THEREOF

CROSS-REFERENCE TO RELATED APPLICATION

This application claims the priority of Chinese patent application number 201810045173.3, filed on Jan. 17, 2018, the entire contents of which are incorporated herein by reference.

TECHNICAL FIELD

The present invention relates to the field of chip integration, and more particularly relates to a multi-layer chip and a fabrication method thereof.

BACKGROUND

Three-dimensional integration (3D-IC) is a solution for improving chip performance while keeping the current technology nodes, and it has many advantages. For instance, functions of a chip can be greatly improved without changing the size of the chip or limited by the manufacturing process of a single chip; metal interconnections between the chips can be highly shortened, so that heat generation, power consumption and delays are reduced; and a band width between functional modules can be greatly enhanced, for example, when a processor chip and a memory chip are subjected to three-dimension integration, the resulted processor can have an ultra-high speed buffer memory.

The existing 3D-IC technology is able to integrate two different chips through through-silicon via or mixed bonding, and can achieve integration and improve device performance. However, along with development of science and technology, higher and higher requirements for device performance and integration degree are raised, and the integration of two layers of chips cannot meet the requirements any more, so it is necessary to develop new technology for the integration of three or more chips.

SUMMARY OF THE INVENTION

The present invention provides a multi-layer chip and a fabrication method thereof to overcome the above problems or at least partially solve the above problems.

According to one aspect of the present invention, a multi-layer chip is provided, and includes a first chip, the first chip having a first metal layer; a second chip bonded with the first chip, the second chip having a second metal layer, the second metal layer metal-bonded with the first metal layer; a first oxide layer on the second chip; and a third chip having a second oxide layer and a third metal layer, the second oxide layer bonded with the first oxide layer, and the third metal layer being interconnected with the second metal layer.

Further, the multi-layer chip may further include a SiN masking layer covering the third chip.

Further, a first metal contact is formed in the second chip, the first metal contact is connected to the second metal layer and is further interconnected with the third metal layer.

Further, a second metal contact is formed in the third chip, and the second metal contact is connected to the third metal layer and the first metal contact.

Specifically, the second chip has a thickness of 2.3-3 µm, and the third chip has a thickness of 2.3-3 µm.

According to another aspect of the present invention, a method for fabricating the multi-layer chip is further provided, and includes:

bonding a first chip having a first metal layer to a second chip having a second metal layer;

forming a first metal contact in the second chip, the first metal contact connecting to the second metal layer;

depositing oxide on the second chip to form a first oxide layer;

bonding the first oxide layer and a second oxide layer of a third chip; and forming a second metal contact penetrating through the first oxide layer and the second oxide layer for connecting the first metal contact with a third metal layer in the third chip via the second metal contact.

Further, before forming the first metal contact in the second chip, the method further includes: thinning the second chip.

Further, forming the second metal contact penetrating through the first oxide layer and the second oxide layer includes:

etching a through hole and/or a trench penetrating through the second oxide layer, the first oxide layer and at least part of a substrate of the third chip; and forming the second metal contact in the through hole and/or the trench, so as to connect the first metal contact with the third metal layer in the third chip.

Further, before forming the second metal contact penetrating through the first oxide layer and the second oxide layer, the method further includes: thinning the third chip.

Further, the second chip has a thickness of 2.3-3 µm; the third chip has a thickness of 2.3-3 µm.

Further, after forming the second metal contact penetrating through the first oxide layer and the second oxide layer, the method further includes:

forming a SiN masking layer on the third chip.

The present invention provides the multi-layer chip and the fabricating method thereof. The method includes performing oxidizing bonding of the third-layer chip on a basis of mixed bonding of two layers of chips, the metal contact is arranged, metal interconnection is performed on the second chip and the third chip through the metal contact, so that integration of three layer of chips is achieved, which fulfills the target for integration of three layers of chips and meets the requirements for higher device performances and higher integration degrees.

1—first chip, 2—second chip, 3—third chip, 41—first oxide layer, 42—second oxide layer, 5—SiN masking layer, 11—first metal layer, 21—second metal layer, 22—first metal contact, 31—third metal layer, 32—second metal contact.

DETAILED DESCRIPTION OF EXEMPLARY EMBODIMENTS

The specific implementation manners of the present invention are further described in detail below in combination with the drawings and the embodiment. The following embodiments are used for illustrating the present invention, but is not used for limiting the scope of the present invention.

Figure 1:
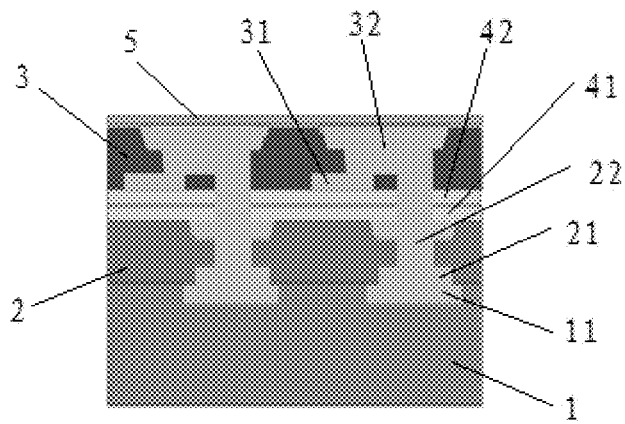
FIG. 1 is a structural schematic view of a multi-layer chip of an embodiment of the present invention.

FIG. 1 is a structural schematic view of a multi-layer chip of an embodiment of the present invention. The multi-layer chip as shown in FIG. 1 includes:

a first chip 1, the first chip 1 having a first metal layer 11;

a second chip 2 bonded with the first chip 1, the second chip 2 having a second metal layer 21, and the second metal layer 21 is metal-bonded with the first metal layer 11;

a first oxide layer 41 on the second chip 2;

a third chip 3 having a second oxide layer 42 and a third metal layer 31, wherein the second oxide layer 42 is bonded with the first oxide layer 41, and the third metal layer 31 is interconnected with the second metal layer 21; and a SiN masking layer 5 covering the third chip 3.

In one optional embodiment, a first metal contact 22 is arranged in the second chip 2, and the first metal contact 22 is connected to the second metal layer 21, and the second metal layer 21 is interconnected with the third metal layer 31.

In one optional embodiment, a second metal contact 32 is arranged in the third chip 3, and the second metal contact 32 is connected to the third metal layer 31 and the first metal contact 22.

In the embodiment of the present invention, the interconnection between the second chip 2 and the third chip 3 is achieved via the first metal contact 22 and the second metal contact 32, so that interconnections among the first, second and third chips are achieved.

Specifically, a thickness of the second chip 2 is from 2.3 µm to 3 µm; and a thickness of the third chip 3 is from 2.3 µm to 3 µm.

In one optional embodiment, the multi-layer chip further includes the SiN masking layer 5 covering the third chip 3.

Compared with the bonding of two layers of chips in the prior art, the embodiment of the present invention is able to achieve bonding of three layers of chips as well as metal interconnections among the three layers of chips, which fulfills the target for integration of three layers of chips and meets the requirements for higher device performances and higher integration degrees. The resulted multi-layer chip is small in size and high in integration degree, and therefore can be more conveniently applied to occasions with various performance requirements while ensuring a good electrical performance.

Figure 2:
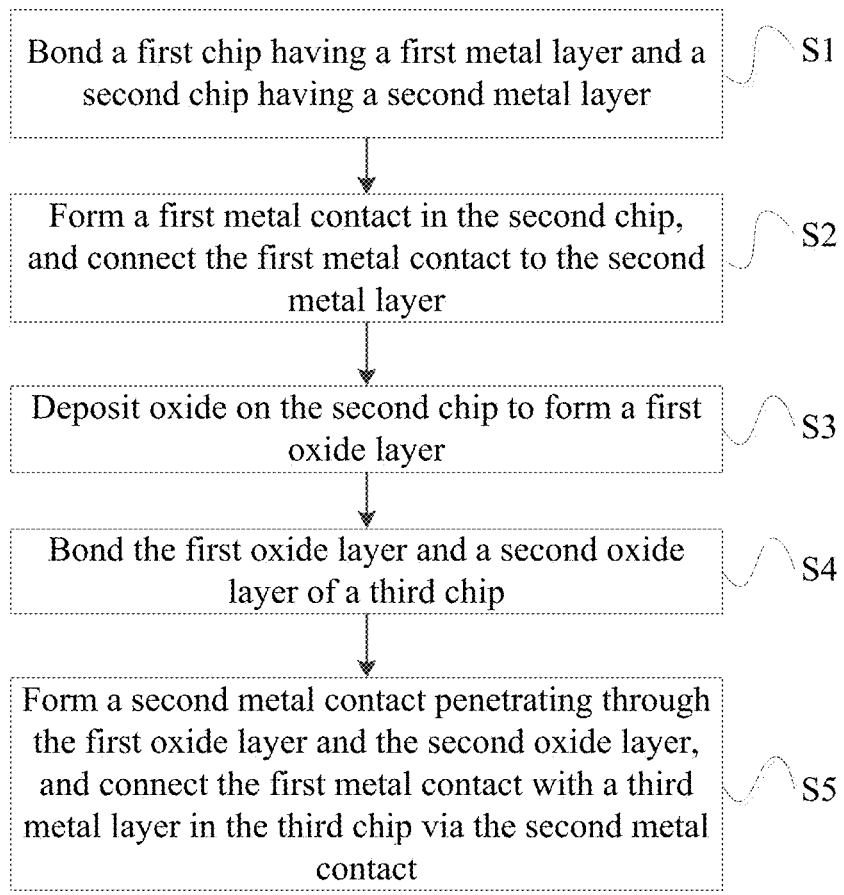
FIG. 2 is a flow diagram of a fabrication method of the multi-layer chip of the embodiment of the present invention.

FIG. 2 is a flow schematic view of a fabrication method of the multi-layer chip of the embodiment of the present invention. The fabrication method of the multi-layer chip as shown in FIG. 2 includes:

S1, mixed bonding a first chip having a first metal layer and a second chip having a second metal layer;

S2, forming a first metal contact in the second chip, and connecting the first metal contact to the second metal layer; specifically, the lead-out metal contact may be designed according to practical needs, and preferably, the metal contact may be formed by using the Via technology;

S3, depositing oxide on the second chip to form a first oxide layer on the second chip; and depositing oxide on a third chip to form a second oxide layer on the third chip;

S4, stacking the third chip on the second chip by bonding the first oxide layer of the second chip with the second oxide layer of the third chip; and S5, forming a second metal contact penetrating through the second oxide layer and the first oxide layer so as to connect the first metal contact with a third metal layer in the third chip via the second metal contact.

In the fabrication method of the multi-layer chip of the embodiment according to the present invention, the third chip is oxidized and has a metal contact formed therein for interconnecting the second chip with the third chip, and thereby achieving integration of three layers of chips, which fulfills the target for integration of three layers of chips and meets the requirements for higher device performances and higher integration degrees.

The fabrication method of the multi-layer chip of the embodiment of the present invention may also be applicable to a multi-layer chip fabrication method for integrating more than three layers of chips. Based on the integration of third chips as described above, a subsequent chip integration can be achieved by repeating the steps of S3-S5, and is not described in detail herein.

In one optional embodiment, the method further includes thinning the second chip before forming the first metal contact in the second chip that connects the second metal layer in step S2.

Specifically, the thinned second chip has a thickness of from 2.3 µm to 3 µm.

Specifically, in the embodiment of the present invention, the second chip is thinned in order to reduce a size of the chip while ensuring the electrical performance of the chip. Preferably, a thickness of the thinned second chip is 2.3 µm; or preferably, a thickness of the thinned second chip is 3 µm.

In one optional embodiment, the step S5 of forming a second metal contact penetrating through the second oxide layer and the first oxide layer so as to connect the first metal contact with a third metal layer in the third chip via the second metal contact, specially includes:

etching a through hole and/or a trench penetrating through the first oxide layer, the second oxide layer and at least part of a substrate (main body) of the third chip; and forming the second metal contact in the through hole and/or the trench, so as to connect the first metal contact with the third metal layer in the third chip.

Specifically, in the embodiment of the present invention, the through hole and/or the trench may be formed by using the TSV technology. The temperature, control time and the like for specific implementation may be determined according to the conditions for chip integration, and the embodiment of the present invention may not have special requirements for these parameters. By filling the through hole and/or the trench with metal, the resulted second metal contact can penetrate through the first oxide layer and the second oxide layer, so as to interconnect the second chip and the third chip.

In one optional embodiment, the method further includes thinning the third chip before forming the second metal contact penetrating through the first oxide layer and the second oxide layer for interconnecting the first metal contact with the third metal layer in step S5. Specifically, the thinned third chip has a thickness of from 2.3 µm to 3 µm.

In the embodiment of the present invention, the third chip is thinned in order to reduce the size of the integrated chip while ensuring the electrical performance of the chip. Specially, a thickness of the thinned third chip is 2.3 µm; or a thickness of the thinned third chip is 3 µm.

In one optional embodiment, after forming the second metal contact penetrating through the first oxide layer and the second oxide layer for interconnecting the first metal contact with the third metal contact, the method further includes: step S6, forming a SiN masking layer on the third chip.

In the embodiment of the present invention, the through hole and/or the trench may be formed by using the TSV technology. The position and shape of the through hole and/or the trench may be determined according to a circuit design requirement. A copper wire is arranged in the through hole and/or the trench, so that the second chip is in communication with the third metal layer of the third chip via the copper wire, and hence, the three layers of chips are in communication with each other. Finally, after communication of the three layers of chips is achieved, a non-bonding surface of the third chip is covered with the SiN masking layer, and integration of the three layers of chips is completed.

Figure 3A:
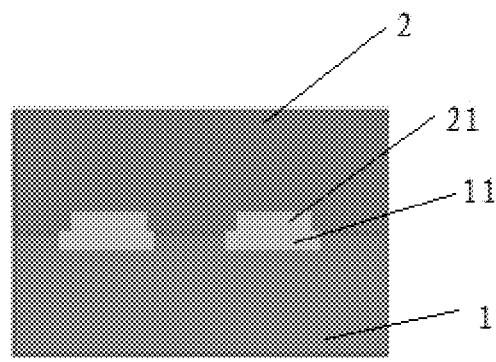
FIG. 3a is a process schematic view of bonding of two layers of chips of the fabrication method of the multi-layer chip of the embodiment of the present invention.
Figure 3B:
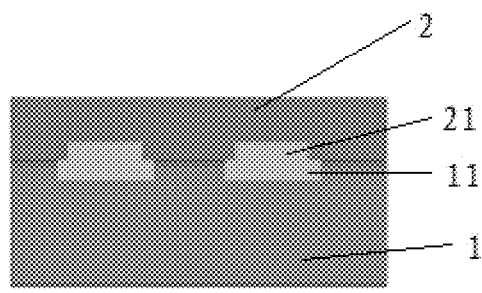
FIG. 3b is a process schematic view of silicon thinning after bonding of the two layers of chips of the fabrication method of the multi-layer chip of the embodiment of the present invention.
Figure 3C:
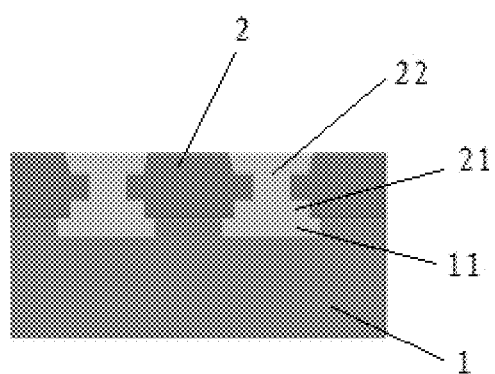
FIG. 3c is a process schematic view of lead-out of a metal wire of the fabrication method of the multi-layer chip of the embodiment of the present invention.
Figure 3D:
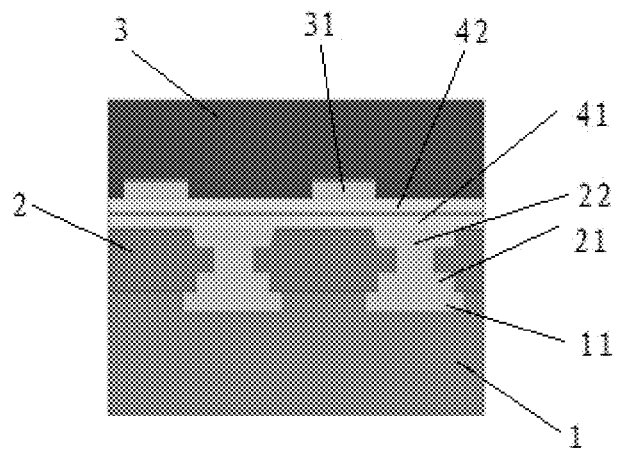
FIG. 3d is a process schematic view of OX bonding of three layers of chips of the fabrication method of the multi-layer chip of the embodiment of the present invention.
Figure 3E:
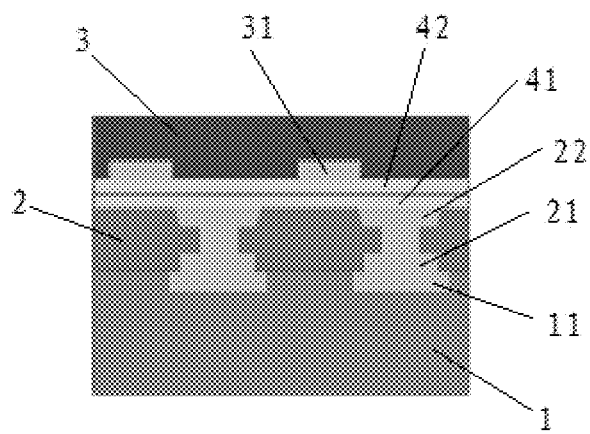
FIG. 3e is a process schematic view of silicon thinning of a third-layer chip of the fabrication method of the multi-layer chip of the embodiment of the present invention.
Figure 3F:
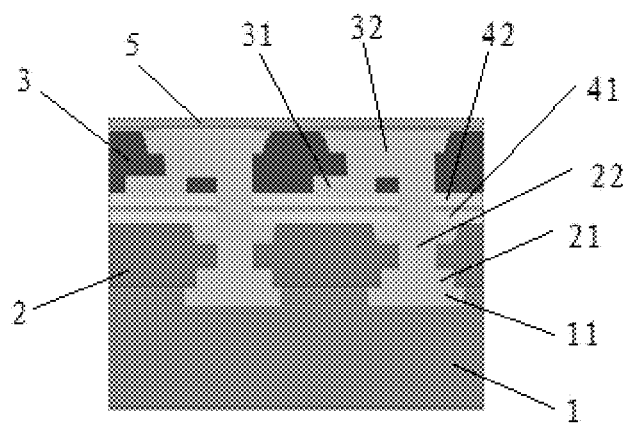
FIG. 3f is a process schematic view of TSV metal interconnection of the fabrication method of the multi-layer chip of the embodiment of the present invention.

FIG. 3a to FIG. 3f are process schematic views of TSV metal interconnection of the fabrication method of the multi-layer chip of the embodiment of the present invention. Referring to FIG. 3a to FIG. 3f, a three-dimension integration method performed by using the TSV and mixed bonding technologies includes:

1) mixed bonding two layers of chips, as shown in FIG. 3a;

2) thinning one of the chips that have been bonded, as shown in FIG. 3b;

3) leading out a metal wire towards the direction of the surface which has been thinned, that is, a first metal contact is formed, as shown in FIG. 3c;

4) bonding a third chip on the thinned chip by an oxidizing technology, as shown in FIG. 3d;

5) thinning the third chip, as shown in FIG. 3e; it shall be appreciated that, a thickness of the thinned second-layer chip may be equal to, or not equal to that of the thinned third-layer chip, and the present invention is not limited; and 6) forming a through hole and/or a trench by using the TSV technology, and forming a second metal contact for interconnecting the second chip and the third chip metal contact so as to achieve circuit communication, as shown in FIG. 3f, and the size of the integrated chip is also designed according to a DESIGN requirement.

To sum up, the fabrication method of the multi-layer chip of the embodiment of the present invention includes: leading out a metal wire after bonding of two layers of chips, and thinning the second chip; bonding a third chip and thinning the third chip; forming a through hole and/or a trench connecting the second chip and the third chip by the TSV technology; and filling the through hole and/or trench with Cu to achieve metal interconnection between the second chip and the third chip, so as to achieve integration of three layers of chips, which fulfills the target for integration of three layers of chips and meets the requirements for higher device performances and higher integration degrees, it is achieved that the three-layer integrated chip is small in size, the multi-layer chip can be more conveniently applicable to occasions with various performance requirements on a premise that electrical performance is achieved, and good beneficial effects are achieved.

It should be illustrated finally that, the above embodiments are only used for illustrating the technical solutions of the present invention, and are not intended to limit the present invention; although the present invention is illustrated in detail with reference to the foregoing embodiments, it should be understood by those skilled in the art that, modifications may still be made on the technical solutions written by the foregoing embodiments, or equivalent replacements are made on part of technical features; and these modifications or replacements do not make the essence of the corresponding technical solutions break away from the spirit and scope of the technical solution of the various embodiments of the present invention.

What is claimed is:

1. A multi-layer chip, comprising:
a first chip, the first chip having a first metal layer;
a second chip bonded with the first chip, the second chip having a second metal layer, the second metal layer bonded with the first metal layer;
a first oxide layer on the second chip; and
a third chip having a second oxide layer and a third metal layer, the second oxide layer bonded with the first oxide layer, and the third metal layer being connected to the second metal layer.

2. The multi-layer chip according to claim 1, wherein a first metal contact is formed in the second chip, the first metal contact is connected to the second metal layer and is further connected to the third metal layer.

3. The multi-layer chip according to claim 2, wherein a second metal contact is formed in the third chip, and the second metal contact is connected to the third metal layer and the first metal contact.

4. The multi-layer chip according to claim 1, wherein the second chip has a thickness of 2.3-3 µm, and the third chip has a thickness of 2.3-3 µm.

5. The multi-layer chip according to claim 1, further comprising a SiN masking layer covering the third chip.

6. A method for fabricating a multi-layer chip, comprising:
bonding a first chip having a first metal layer to a second chip having a second metal layer;
forming a first metal contact in the second chip, the first metal contact connecting to the second metal layer;
depositing oxide on the second chip to form a first oxide layer;
bonding the first oxide layer and a second oxide layer of a third chip; and
forming a second metal contact penetrating through the first oxide layer and the second oxide layer for connecting the first metal contact with a third metal layer in the third chip via the second metal contact.

7. The method according to claim 6, wherein before forming the first metal contact in the second chip, the method further comprises:
thinning the second chip.

8. The method according to claim 7, wherein the second chip has a thickness of 2.3-3 µm.

9. The method according to claim 6, wherein forming the second metal contact penetrating through the first oxide layer and the second oxide layer comprises:
- etching a through hole and/or a trench penetrating through the second oxide layer, the first oxide layer and at least part of a substrate of the third chip; and
- forming the second metal contact in the through hole and/or the trench, so as to connect the first metal contact with the third metal layer in the third chip.

10. The method according to claim 6, wherein before forming the second metal contact penetrating through the first oxide layer and the second oxide layer, the method further comprises:
- thinning the third chip.

11. The method according to claim 9, wherein the third chip has a thickness of 2.3-3 µm.

12. The method according to claim 6, wherein after forming the second metal contact penetrating through the first oxide layer and the second oxide layer, the method further comprises:
- forming a SiN masking layer on the third chip.

* * * * *